(12) United States Patent
Bernard

(10) Patent No.: US 6,549,098 B1
(45) Date of Patent: Apr. 15, 2003

(54) HIGH VOLTAGE POWER TRANSMISSION LINE FILTER SYSTEM AND MODULE

(75) Inventor: Edward Helmut Bernard, Maidstone (CA)

(73) Assignee: Bernard Mould Limited (CA)

( * ) Notice: Subject to any disclaimer, the term of this patent is extended or adjusted under 35 U.S.C. 154(b) by 0 days.

(21) Appl. No.: 10/027,092

(22) Filed: Dec. 20, 2001

Related U.S. Application Data
(60) Provisional application No. 60/293,850, filed on May 25, 2001.

(51) Int. Cl.$^7$ ................................................ H03H 7/00
(52) U.S. Cl. ........................................ 333/181; 333/185
(58) Field of Search .......................... 333/12, 175, 181, 333/182, 183, 185; 336/221, 90; 361/302, 328

(56) References Cited

U.S. PATENT DOCUMENTS

| | | | | |
|---|---|---|---|---|
| 3,035,237 A | * | 5/1962 | Schlicke | .................... 333/182 |
| 4,581,596 A | * | 4/1986 | Dirmeyer et al. | ........... 333/181 |
| 5,195,232 A | * | 3/1993 | Frederick | .................... 333/185 |

* cited by examiner

Primary Examiner—Seungsook Ham
(74) Attorney, Agent, or Firm—Reising, Ethington, Barnes, Kisselle, Learman & McCulloch, PC; William J. Waugaman

(57) ABSTRACT

An improved filter assembly module comprising an open-ended cylindrical housing containing a spindle chassis with a base radially centering the chassis in the housing. Three spindle, rods extending from the base and three sets of three cylindrical spool-wound capacitors are spindle-mounted one set on each rod. A position stabilizer mounted on the upper ends of spindle rods makes stabilizing contact with the housing inner wall. An inductance coil and core is held beneath the base by a plurality of short rods protruding from the base and by a retainer snap-fastened on the rod ends. A housing bottom cover encloses the inductance coil, short rods and retainer, and a cap closes the housing top end. Electrical circuit connectors electrically couple the capacitors, inductance coil and ground and provide output signal leads for coupling to an associated meter or the like. The housing interior space, cover, cap, capacitors, inductance coil, position stabilizer and coil retainer are all totally immersed and engulfed in a solidified thermosetting dielectric insulation material cast in-situ in the housing, cover and cap.

22 Claims, 9 Drawing Sheets

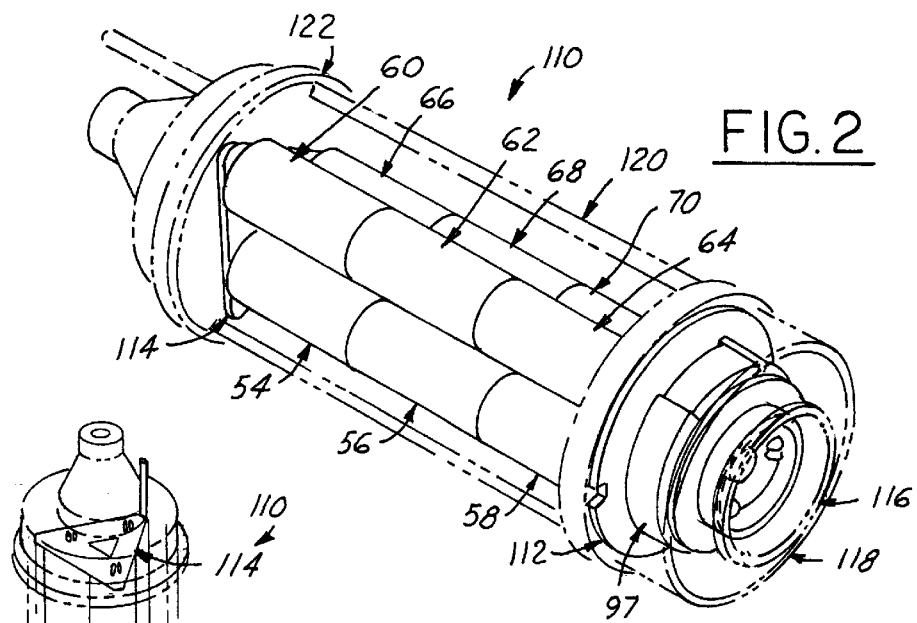
FIG. 2
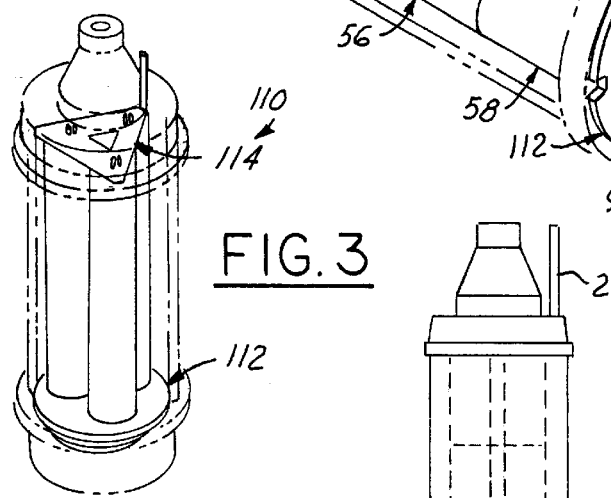
FIG. 3
FIG. 5
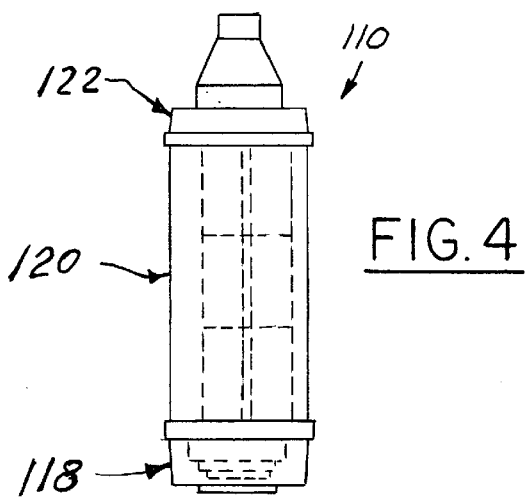
FIG. 4
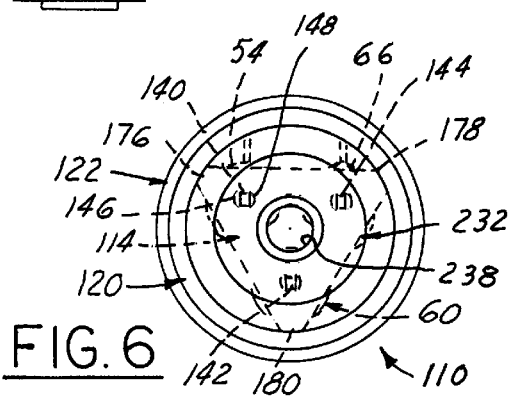
FIG. 6

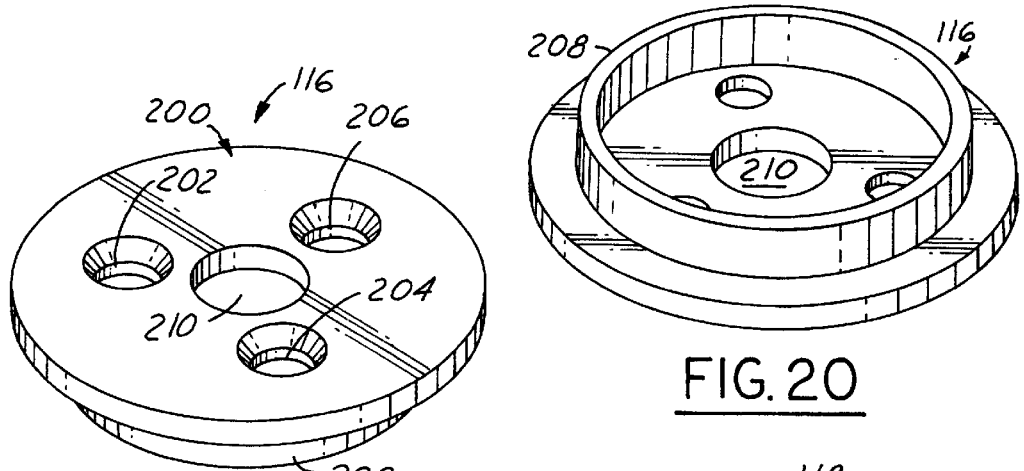
FIG. 18
FIG. 20
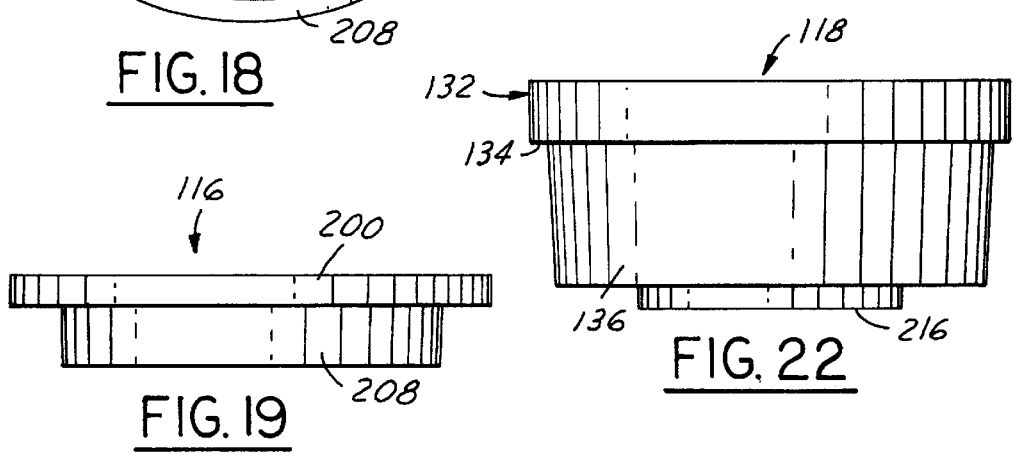
FIG. 19
FIG. 22
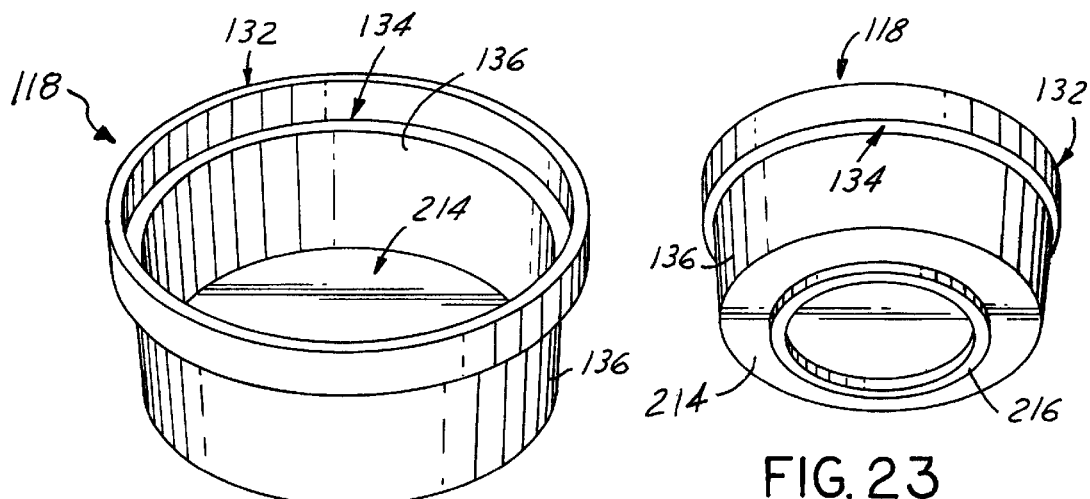
FIG 21
FIG. 23

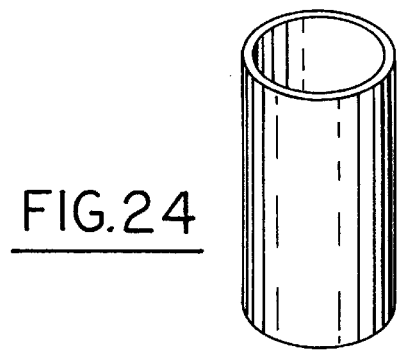 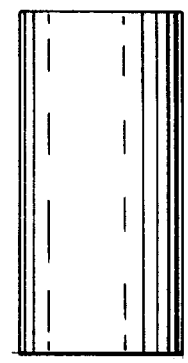
FIG. 24  FIG. 25
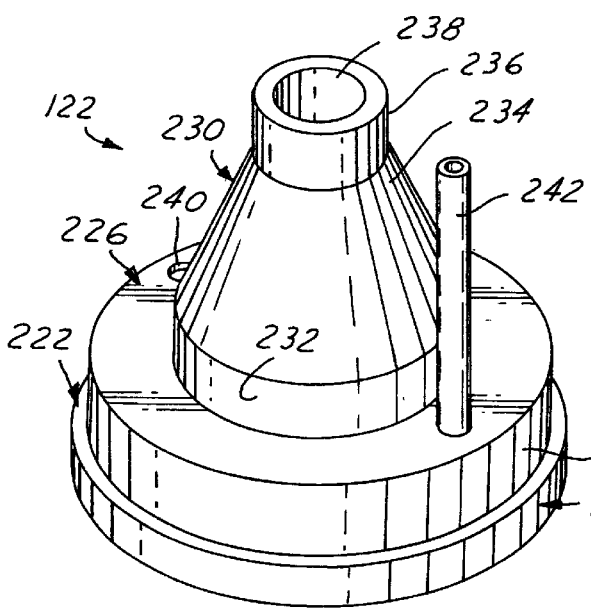
FIG. 26
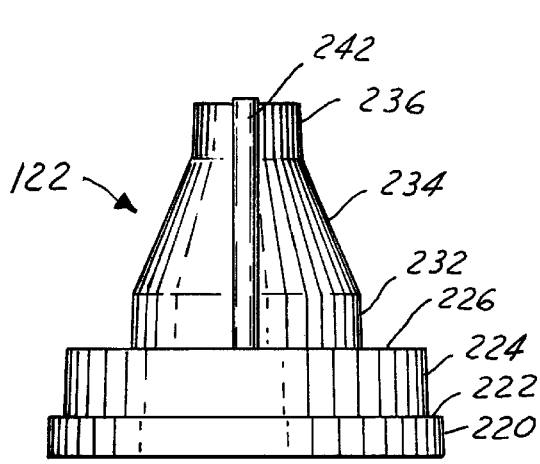
FIG. 27
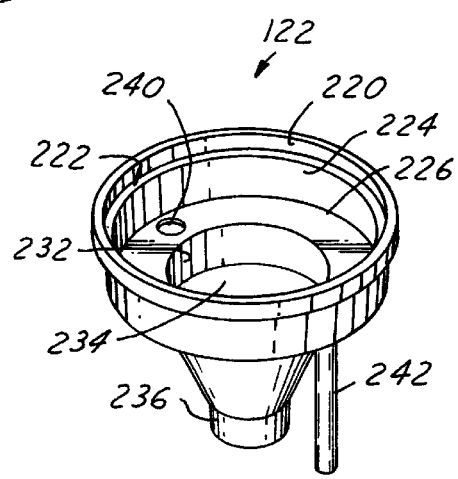
FIG. 28

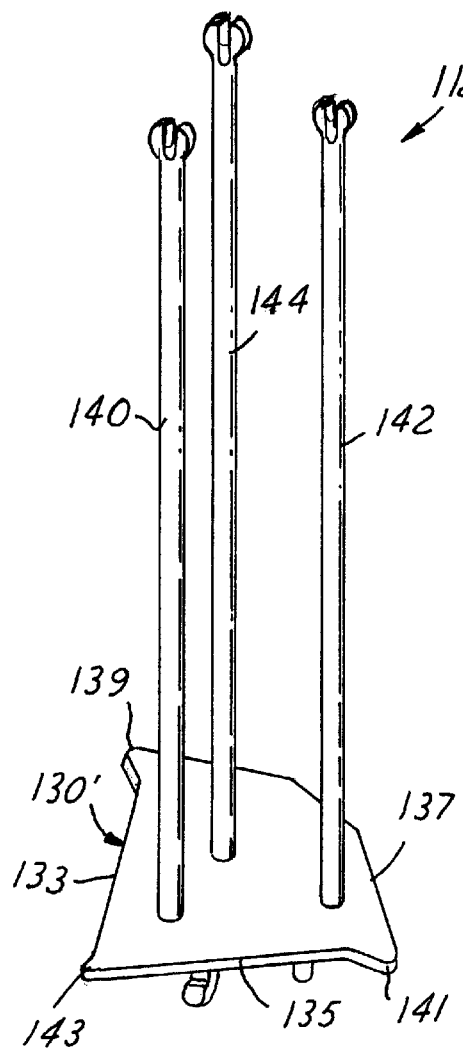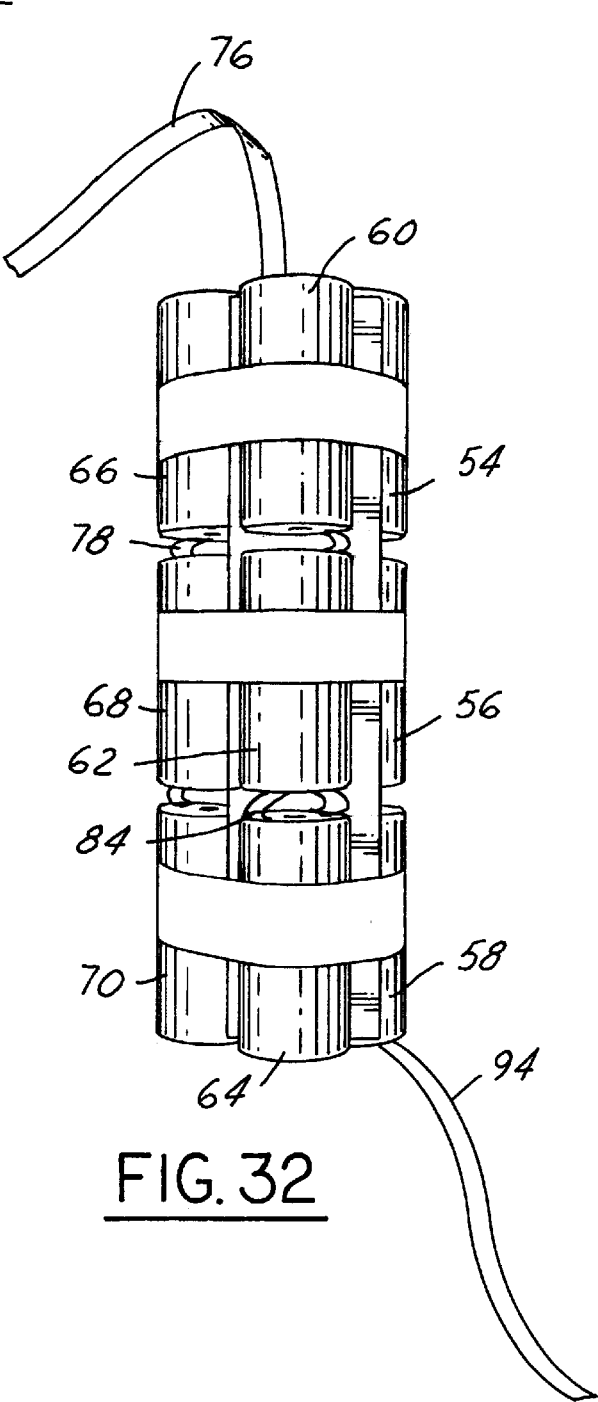
FIG. 31
FIG. 32

HIGH VOLTAGE POWER TRANSMISSION LINE FILTER SYSTEM AND MODULE

This is a regular United States utility patent application filed pursuant to 35 USC § 111 (a) and claiming the benefit under 35 U.S.C. § 119 (e) (1) of the priority of provisional patent application Ser. No. 60/293,850 filed on May 25, 2001.

FIELD OF THE INVENTION

This invention relates to high voltage power transmission line metering systems, and more particularly to a filtering system and module for enhancing data communication about and on power transmission lines.

BACKGROUND OF THE INVENTION

One of the problems encountered by electric public utilities in the transmission and distribution of electrical power through their high voltage power transmission system and network is the loss of power by theft from various locations along their sub-branch distribution lines of the network where power is connected to the ultimate consumer. For example, it has been reported that an electric public utility serving various remote areas of British Columbia in Canada has experienced loss by theft of a considerable quantity of electrical power to illegal marijuana growing installations. Such illegal growers have been known to buy or just move as squatters into an abandoned building. They then reconnect the existing disconnected power service line to their building power service lines in order to illegally provide electrical power service to their greenhouse operations for growing marijuana. Short of actually patrolling and inspecting all customer metering installations along the branch distribution lines, including such disconnected installations at abandoned sites, it has not been economically feasible to remotely pinpoint the geographic location where such power theft losses are occurring. Although the amount of power being distributed over a given sub-branch transmission line is metered by transmission line watt meters, due to excessive "noise" in the line, i.e., 60 cycle "hum", it has not been possible to remotely telemeter an individual meter on the power transmission line to determine or pinpoint the location along sections of sub-branch lines that are showing excessive power loss to unauthorized power hook-ups.

In one approach to solving the forgoing power line theft telemetering problem, it has been proposed that the power transmission line be directly filtered to eliminate the interfering noise in the transmission line signal. It is then believed it would be possible to be able remotely identify, by comparative meter data transmitted, the particular geographic location where utility personnel could be directed to look for power theft along the sub-branch line in order to apprehend the thieves and stop the power loss in a timely and efficient manner.

In order to accomplish the electrical noise filtering process proposed hereinabove, it has been further proposed to provide a straight forward filter network between the typical 15 kilovolt electrical power distribution line and an associated watt meter operably connected for sensing the rate of power consumption along such line. Such filter/meter installations would be located at strategic predetermined locations along the power distribution network in order to limit the geographical extent of indicated theft searching to a reasonable geographic area and distance along the line. Such installations would be pole mounted and thus must necessarily be able to withstand the adverse environmental conditions of outdoor powerline equipment and operate in a reliable manner without service for an extensive service life of say up to 100 years.

A proposal for a filter in such a system having the required electrical capacitance and inductance contemplates the provision of a series of cylindrically wound capacitors (or "condensers") that are of limited maximum size in order to be economically producible. Therefore a plurality of such capacitors are to be connected in series to provide the required total capacitance of the capacitive element in the filter circuit.

The inductance contemplated comprises a coil subassembly composed of an annular ferrite core with a primary winding wound on one portion of the core and having an input terminal connected to the output terminal of the array of capacitors and an output terminal connected to ground. The ferrite core would also serve as the flux link to a secondary winding also wound on the ferrite core and having its opposite terminals connected either to an appropriate watt meter or the like provided in close proximity to the filter or to some other digital communication device adapted for remote telemetering. However, the foregoing proposals did not provide a solution to the problem of how to economically construct a high voltage filter module embodying the capacitive and inductive components in a rugged, compact, durable, weather proof and reliable module. Accordingly, it is this latter problem and its solution to which the present invention is directed.

OBJECTS OF THE INVENTION

Accordingly, among the objects of the present invention are to provide an improved electrical filter network or circuit component module that is rugged, durable, difficult if not impossible to disassemble and that is reliably operable for use as a frequency filtering unit to filter out interference signal "noise" from electrical power transmission lines, and particularly, from outdoor electrical utility sub-branch distribution lines so that such filtered signals can be fed to an associated watt meter, volt meter or other digital transmitting units for remote monitoring of customer-metered power consumption versus power loss along the power transmission line.

Another object is to provide an improved module of the foregoing character that provides a holder and protective container for the operative electrical components of the filter network and that allows them to be initially assembled and held for making soldering or other electrical connections between the individual components, that will hold the components in a predetermined array suitably spaced a predetermined distance from one another as well as the container walls in order to enable an electrically insulative and adhesive potting compound to be infilled in a liquid state and then solidify (cure) to thereby provide not only necessary extra electrical insulating properties but also bonding of the components as a solid unit and to protect the components from harsh application environments while at the same time adherently bonding all of the assembly frame parts and related housing cover and cap parts including solder joints.

A further object is to provide an improved module of the foregoing character and improved method of constructing the same that supports and accurately establishes the relative positions of all internal electrical components both during subassembly shipment, circuit component testing and for the duration of the useful life of the module regardless of serious abuses to the module both from outdoor environmental conditions and rough handling during shipment, storage and installation.

Another object is to provide an improved filtering module of the above character and associated telemetering instrumentation in combination with appropriate power line transmission equipment and telemetering instruments in an electrical power distribution system that is operable to adequately electrically filter the electrical power transmission line noise so as to be able to communicate with individual meters and telemeter their condition remotely.

A still further object is to provide a filter module system of the foregoing character that enables the power transmission line to be electrically filtered so as to remove sufficient unwanted and interfering noise in the transmission line to thereby enable digital data to be transmitted over the transmission line so that digital hardwire communication may be enabled to many remote geographic areas that do not have telephone lines or fiber optic lines.

SUMMARY

In general, and by way of summary description and not by way of limitation, the invention achieves one or more of the foregoing objects by providing an improved filter assembly module comprising a cylindrical housing initially open at its opposite ends as made. A chassis component is disposed within the housing and has a planar base with a profile configuration adapted to contact the inner wall of the housing for centering the chassis radially in the housing. The chassis has at least one spindle rod extending within the housing parallel to the longitudinal axis of the housing and perpendicular to the major plane of the base of the chassis. One or more cylindrical spool-wound capacitors are mounted on the spindle rod by having the spindle rod extend axially through a spool-formed central through-passage of the or each capacitor. A position stabilizer is mounted on the spindle rod on the side of the capacitor remote from the chassis base, and also has a profile configuration adapted to contact the housing inner wall. An inductance coil component is disposed beneath the chassis base and held initially in assembly therewith by a plurality of short rods protruding from the base. A bottom cover is secured to and closes the bottom end of the housing so as to enclose therein the inductance coil component, the short rods and a retainer held by the rods. A top is cap secured to the top end of the housing and closes the same. Electrical circuit connector means extend through the cap and are operably and electrically coupled to the capacitors and inductance coil component, and also provide a ground connection as well as an inductively coupled output signal for coupling to an associated meter or the like. The interior space defined between the interior walls of the housing, cover and cap and the exterior surfaces of the capacitor and inductance coil component as well as the exterior surfaces of the chassis, position stabilizer and retainer are totally immersed and engulfed in a solidified thermosetting dielectric insulation material cast in-situ in the housing, cover and cap.

Preferably the chassis has three of such spindle rods extending parallel to one another and spaced apart with their longitudinal axes oriented in a equilateral triangle array. Preferably the capacitive component comprises three sets of a plurality of spool-wound capacitors electrically coupled in series and spindle supported one set on each the spindle rods. Preferably the inductance coil component comprises an inductor in the form of an annular core having a primary winding thereon with its opposite leads coupled one to the output lead of the series coupled capacitors and the other connected to ground. A secondary winding on the core has its opposite ends forming output leads adapted for coupling to the input terminals of the associated metering device or other digital communication device.

Preferably the foregoing filter module is constructed by a novel method wherein the capacitor and inductance components are first assembled to the chassis and then the unoccupied space enclosed by the bottom cover alone is filled with potting compound in a liquid state. Then the lower end of the housing is seated on the cover and is immersed at its lower edge in the potting compound filling the cover. Then the housing is filled with potting compound to engulf the capacitor components therein while being held on spindle rods. The housing potting material likewise engulfs the chassis structure disposed within the housing as the housing is so filled to its upper end brim with the potting compound. Then the electrical leads are trained through the cap and the cap is mounted on the upper end of the housing. Then the space within the cap is infilled with additional potting compound to thereby finish filling with potting compound the entire space enclosed within the said housing, cover and cap.

BRIEF DESCRIPTION OF THE DRAWINGS

The foregoing as well as additional objects, features and advantages of the present invention will become apparent from the following detailed description of the best mode presently known to the inventor of making and using an exemplary but presently preferred embodiment of the invention, from the appended claims and from the accompanying drawings (wherein components are shown to engineering scale unless otherwise indicated), and wherein:

FIG. 2 is a perspective view of a preferred but exemplary embodiment of a filter assembly module of the invention with the housing, bottom cover and top cap shown in phantom to thereby show interior detail.

FIG. 3 is another perspective view of the module of FIG. 2 on a reduced scale and viewed from an angle looking from above and from the side of the module.

FIGS. 4 and 5 are side elevation views of the module of FIGS. 2 and 3 with the view of FIG. 5 rotated 90° about the longitudinal axis of the module from its orientation in FIG. 4.

FIG. 6 is a top view of the module of FIGS. 2–5.

FIGS. 18, 19 and 20 are differing views of a coil retainer component of the module of FIGS. 2–6, FIGS. 18 and 20 being perspective views of the top and bottom sides of the retainer and FIG. 19 being a side elevational view of the retainer.

FIGS. 21, 22 and 23 are differing views of a coil cover component of the module of FIGS. 2–6, FIGS. 21 and 23 being perspective views of the upper and lower ends of the coil cover respectively, and FIG. 22 being a side elevational view thereof.

FIGS. 24 and 25 are respectively perspective and side elevational views of the housing component of the filter module of the invention.

FIGS. 26, 27 and 28 are differing views of the cap component of the module of the invention, FIGS. 26 and 28 being perspective views of the upper and lower ends of the cap respectively, and FIG. 27 being a side elevational view thereof

FIG. 31 is a perspective view of a modified chassis component for use in the module of the invention.

FIGS. 32, 33, 34 and 35 are perspective views of an array of nine capacitors (condensers) separated by shipping spacers and temporarily held together by tape to illustrate the appearance of actual capacitors utilized in a prototype of the module of the invention, and with electrical lead connections made by foil strips as shown, FIG. 32 being a perspective elevational view, FIG. 33 being a perspective end view and FIGS. 34 and 35 being perspective views respectively from opposite ends of the unit with one of the condensers pulled to the side to better illustrate the structure and connection by a foil strip lead therebetween.

DETAILED DESCRIPTION OF PREFERRED EMBODIMENTS

Figure 1:
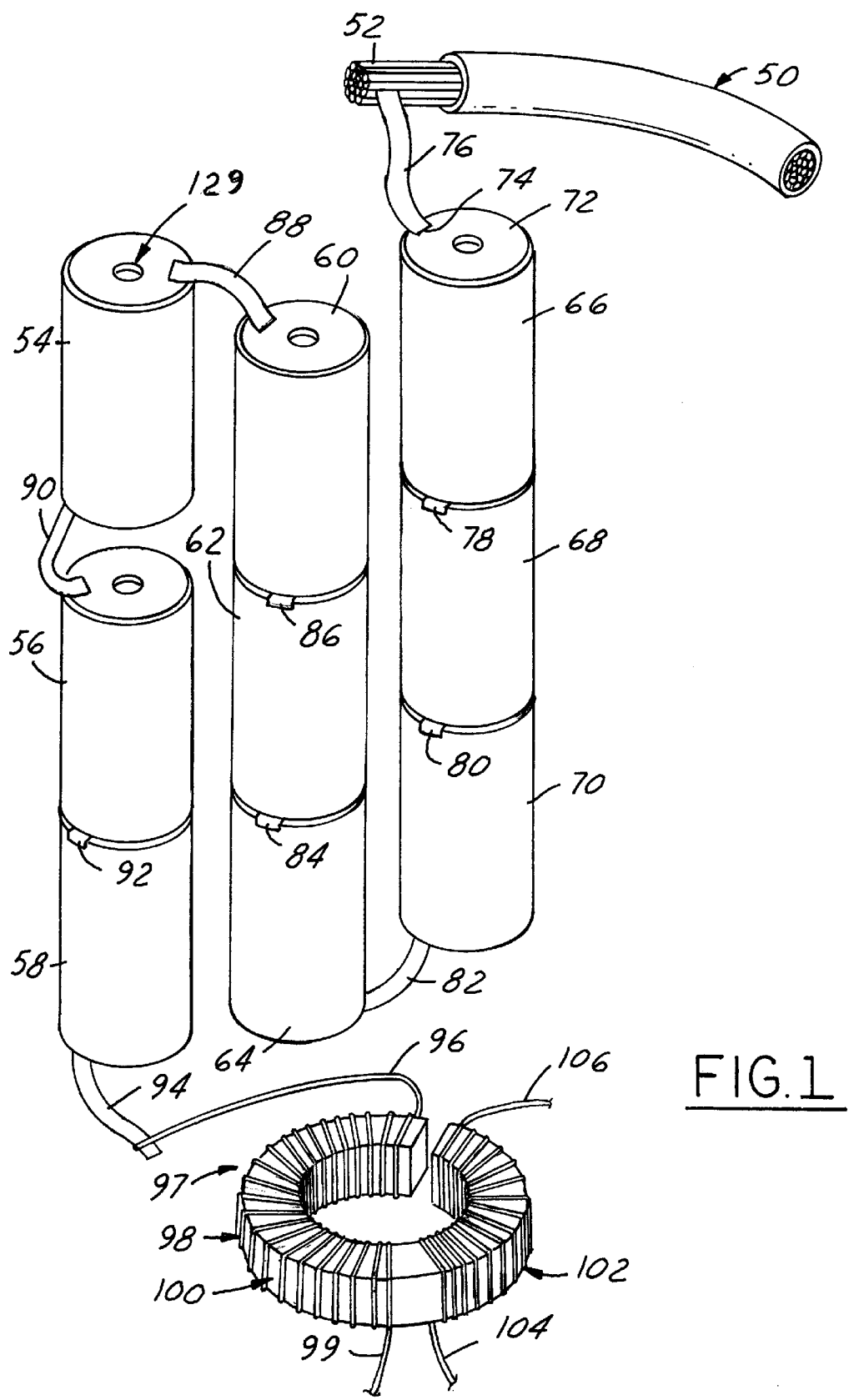
FIG. 1 as a diagrammatic and semi-schematic simplified perspective view of the basic components of a filter circuit for coupling between the utility power distribution line, ground and for operably electrically coupling the filter network to a suitable wattmeter or other digital communication device in accordance with the foregoing background description.

Referring more particularly to the drawings, FIG. 1 illustrates in simplified, semi-diagrammatic perspective view the electrical filter circuit and basic operative components of a filter module or unit of the invention. The filter circuit includes a suitable heavy-duty high-voltage-rated and insulated power line connector in the form of a multiple strand cable 50 having one end 52 bared of insulation. The other end (not shown) of cable 50 is suitably adapted for mechanical electrical coupling to a 15 KV utility power electrical power transmission line (not shown).

The capacitive component of the filter network in the illustrated preferred embodiment comprises a plurality of capacitors (also known as "condensers") herein as shown as nine capacitors 54, 56, 58, 60, 62, 64, 66, 68 and 70 stacked coaxially in three sets of three each and all electrically connected in one series circuit. The upper end face 72 of capacitor 66 has one end 74 of an aluminum foil conductive strip lead 76 soldered thereto, the other end of lead 76 being soldered to the strands at the bared end 52 of cable 50. The nine linked capacitors 54–70 are each wound cylindrically of two foil plates with a dielectric film therebetween, and are constructed so that the opposite end cap layers of each capacitor are electrically connected individually to the opposed plates (i.e. foil layers) within each capacitor. Preferably the total capacitance value of the nine capacitors is 0.1 Microfarad at 15 KV RMS at 60 HZ. Preferably the unit is operable even with a potential of about 10 KV RMS in most of the interfaces where conductors are present. The diameter of each capacitor winding in one exemplary working embodiment is about 1.07 inches. Preferably the windings are sprayed with zinc before the leads are soldered to these parts.

As indicated in FIG. 1, capacitor 66 is electrically coupled to capacitor 68 in series by an aluminum foil strip 78 collapsed in assembly between these two capacitors. Likewise capacitor 68 is electrically connected to capacitor 70 by a connector foil strip 80. Foil strip 82 connects capacitor 70 electrically with capacitor 64. Likewise the remaining capacitors are electrically connected in series by foil strips 84, 86, 88, 90 and 92. The construction of the capacitors 54–70 and the operable electrical intercoupling therebetween via foil strips 76–94 also can be seen in the perspective views of FIGS. 32–35, it being understood that in these views the capacitors 54–70 are being held in a simulated array by friction tape for illustrative purposes only. Likewise, corrugated polypropylene separators appear in these views of FIGS. 32–35 that are used as optional shipment spacers and protectors that need not be employed in the method or assembly process and construction of the invention.

The output of capacitor 58 is connected by foil strip 94 to the input lead 96 of an inductor 97 of the filter circuit. This inductance component, i.e., inductor 97, comprises a multitum primary coil 98 wound about a quarter of the circumference of an annular ferrite core or ferroid 100.

Again, a secondary coil 102 is inductively coupled to coil 98 by winding coil 102 on the side of core 100 opposite that on which winding 98 is wound. Secondary coil 102 has its two opposite end leads 104 and 106 adapted to be connected to the input terminals of a suitable conventional meter for measuring whatever electrical parameter is desired to be employed as a function of power being transmitted in the associated 15 KV utility transmission line.

The aforementioned meter is not shown but could be a standard AC voltmeter for measuring the potential at the point in the distribution line to which the filter assembly module is connected. Typically it is contemplated that a filter assembly module 110 and such associated meter would be pole mounted at specified predetermined locations along the 15 KV transmissions lines. Meter data readings could be either sent by a suitable meter radio transmitter built into the meter or by on-board computer-generated digital communication back along the transmission line. In this manner, over a given time period power consumption data between given metering points can be accumulated and compared to like accumulated power consumption by authorized consumers from their meter reading data and the difference analyzed to reveal normal or abnormal power loss along that section of the line.

The filter assembly comprising the capacitance component, i.e., capacitor array 54–70, in series with inductor component 97 provides a straight-forward LC filter circuit of the band reject type that is designed to present a very high impedance to a narrow frequency band width centered around the standard AC frequency (e.g., 60 cycle) employed by the utility on its transmission lines as the power transmission frequency standard. The filter therefore eliminates this 60 cycle "hum" and thereby enables the meter coupled to lead 104 and 106 to function without such noise or interference adversely affecting its performance.

Filter Assembly Module

In accordance with one principal feature of the present invention, the forgoing circuitry components 50–106 are securely supported in an operable array by cooperative support members and encasing housing parts as a complete filter assembly module 110 shown in FIGS. 26. Filter assembly module 110 is made up of six basic support and encasing components comprising a chassis 112 shown by itself in FIGS. 9, 10 and 11; a position stabilizer 114 shown by itself in FIGS. 12, 13 and 14; a coil retainer 116 shown by itself in FIGS. 18, 19 and 20; a coil cover 118 shown by itself in FIGS. 21, 22 and 23; a housing 120 shown by itself in FIGS. 24 and 25; and a cap 122 shown by itself in FIGS. 26, 27 and 28.

Figure 7:
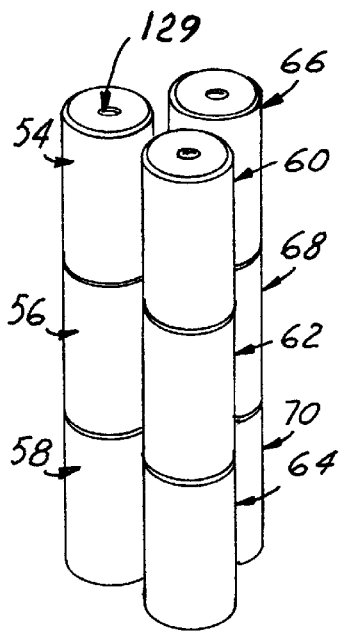
FIG. 7 is a perspective view illustrating the orientation of nine "condensers" (i.e., capacitors) making up the capacitance portion of the filter network of the module as the same are to be held and secured in operative relationship in the filter module of the invention.
Figure 8:
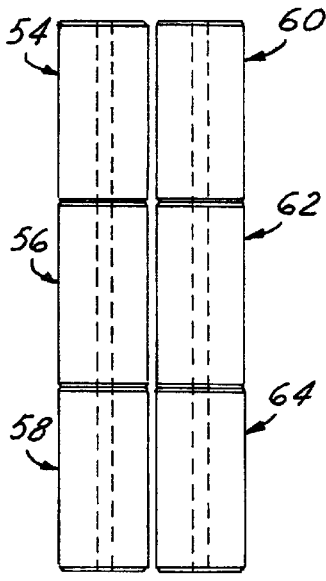
FIG. 8 is a side elevational view of the array of FIG. 7 but on a reduced scale relative thereto.

In the exemplary but preferred embodiment of module 110 illustrated in FIGS. 2–6, it is preferred to orient the nine individual capacitors 54–70 in three axially co-extensive stacks with three capacitors in each stack as shown in FIGS. 7 and 8, and with a predetermined lateral (radial) spacing between each stack. Preferably the manufacture of capacitors 54–70 is specified so that they are wound on a spooling core of a specified predetermined diameter so that each capacitor has an axially extending central through bore, indicated at 129 in the case of the capacitor 54 in FIGS. 1 and 7. It will thus be seen that the array of capacitors 54–70 in the preferred orientation illustrated in FIGS. 7 and 8 also appears as the orientation of these capacitors in the finished filter assembly module 110 as seen in FIGS. 2–6.

Chassis 112

Figure 9:
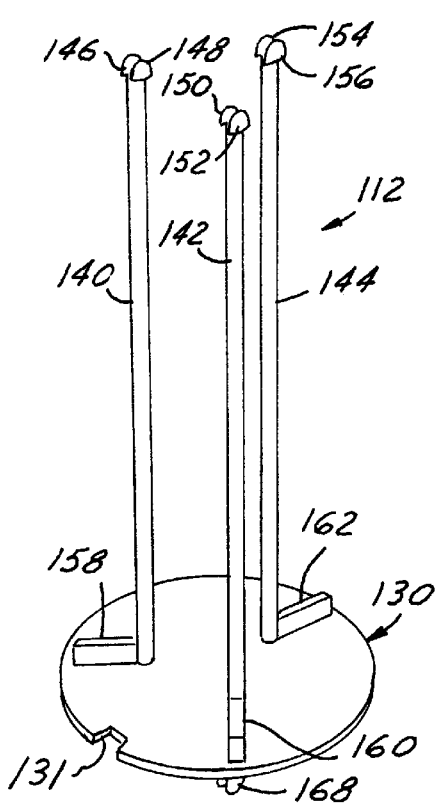
FIG. 9 is a perspective view of a chassis component of the module viewed from above and to the side of the same.
Figure 10:
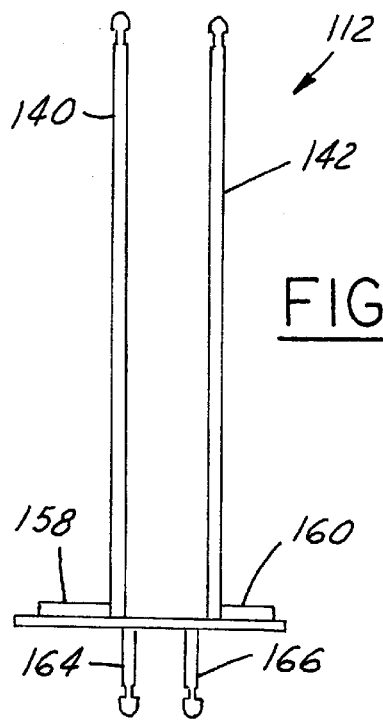
FIG. 10 is a side elevational view of the chassis of FIG. 9.
Figure 11:
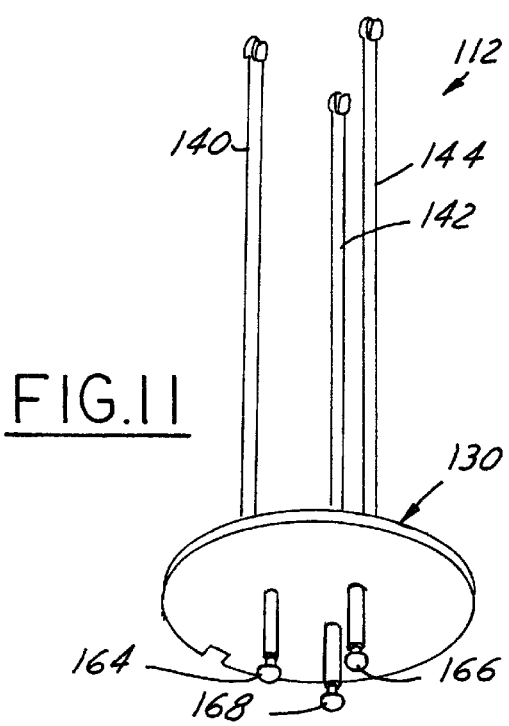
FIG. 11 is a perspective view of the chassis of FIGS. 9 and 10 as viewed from the side and slightly below the same.

As best seen in FIGS. 9, 10 and 11, chassis 112 is preferably a one piece injection molded plastic part, preferably molded of a suitable conventional ultraviolet stabilized, glass-filled polycarbonate or a PC/ABS blend. Chassis 112 comprises a planar base 130 which in the embodiment of FIGS. 9–11 is in the form of a circular disk designed for a close clearance fit into a collar 132 of coil cover 118 (FIG. 21) and to rest on a shoulder flange 134 that joins collar 132 with the main cylindrical wall 136 of cover 118. Chassis 112 also includes three cylindrical spindle rods 140, 142 and 144 integrally joined at their lower ends to base 130 and extending upwardly from base 130 with their axes perpendicular to the plane of base 130 ("integral" as used herein means joined by being molded as one-piece). Pairs of arrowhead-like snap catches 146 and 148, 150 and 152, and 154 and 156 are integrally molded respectively on the upper ends of rods 140, 142 and 144. Catches 146–156 form tongs that protrude laterally radially outwardly beyond the O.D. of each respective rod shank and are each provided with an outwardly facing cammming side surface tapering to a narrow leading edge at its upper end.

Chassis 112 is also provided with three integral stand-off ribs 158, 160 and 162 extending radially outwardly from the base of rods 140, 142 and 144 respectively and axially upwardly from the upper surface of base 130, as seen in FIGS. 9 and 10. As shown in FIGS. 10 and 11, base 130 also has three short rods 164, 166 and 168 protruding from its undersurface with their axes perpendicular to the plane of the base and for a predetermined relatively short distance Rods 164, 166 and 168 are oriented in an equilateral triangle or array complimentary to the like array of spindle rods 140, 142 and 144 but are radially inwardly offset therefrom equidistantly. Rods 140, 142 and 144 are axially coextensive with one another, and likewise as to short rods 164, 166 and 168. The short rods also each have the same arrowhead-like split snap catch head configuration as rods 140, 142 and 144 and that are thus constructed in like form to heads 146–156 of rods 140–144.

Position Stabilizer 114

Figure 12:
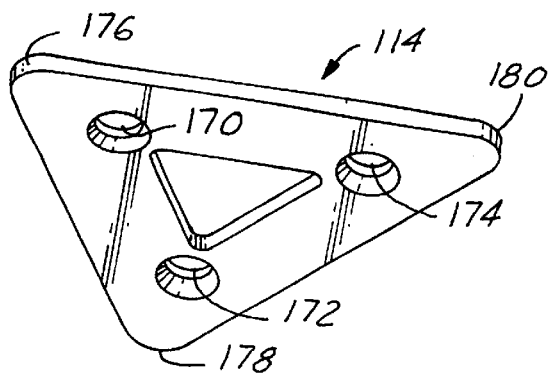
FIGS. 12 and 13 are perspective views of the under side and upper side respectively of a position stabilizer component of the module assembly of the invention.
Figure 13:
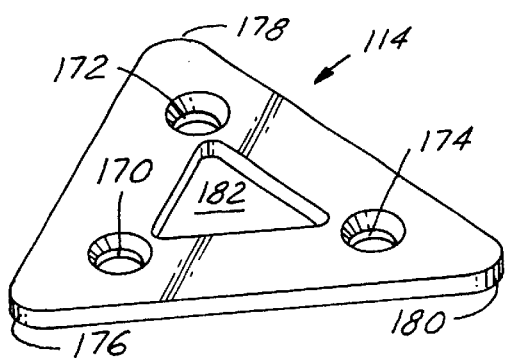
Figure 14:
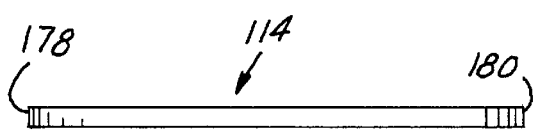
FIG. 14 is a side elevational view of the stabilizer of FIGS. 12 and 13.

Referring to FIGS. 12, 13 and 14, position stabilizer 114 comprises a planar part in the form of equilateral triangle and provided with three through-holes 170, 172 and 174 spaced inwardly from each of the respectively individually adjacent rounded corners 176,178 and 180 of the peripheral side surface of stabilizer 114. The centers of holes 170, 172 and 174 are located by design to be respectively coincident with the axis of rods 140, 142 and 144 when in their nominal free-state design orientation in parallelism to one another. The central opening 182 of stabilizer 114 is likewise of equilateral triangular configuration complimental to the exterior periphery of stabilizer 114. The apex of each of the outside three corners 176, 178 and 180 of stabilizer 114 is tangent to a circle having a diameter dimensioned for a close clearance fit of these corners within the inner wall of housing 120 when stabilizer 114 is in final assembly therewith and the major plane of stabilizer 114 is oriented perpendicular to the longitudinal center axes of housing 120. Preferably each of the rod openings 170, 172 and 174 is chamfered from each opposite side of stabilizer 114 to facilitate passage therethrough of the cam catch split tangs 146–156 of rods 140, 142 and 144 in the module assembly procedure. Again, the fit of the shank of each of spindle rods 140–144 in the associated stabilizer openings 170–174 is a relatively close clearance fit to enable stabilizer 114 to help maintain and thus stabilize the design location of the upper ends of rods 140–144 transversely of housing 120.

Inductor 97

Figure 15:
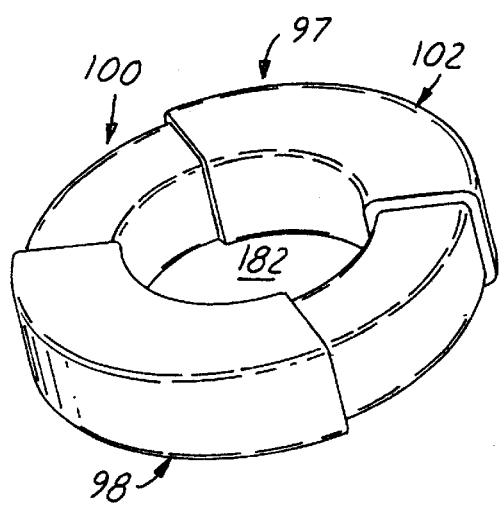
FIGS. 15, 16 and 17 are simplified semi-diagrammatic views of an inductance coil component of the module of FIGS. 2–6, FIGS. 15 and 16 being perspective views of the upper and under sides respectively, and FIG. 17 being a side elevational view thereof.
Figure 16:
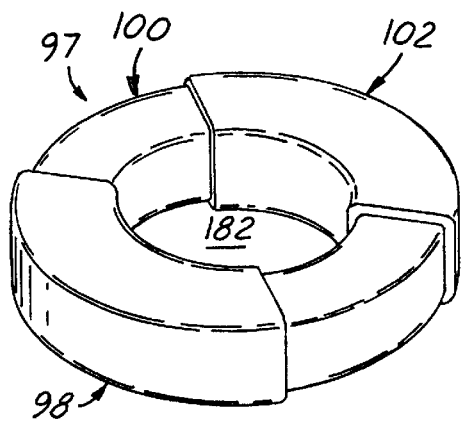
Figure 17:
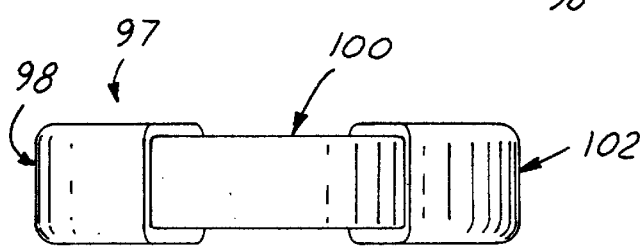

Referring to FIGS. 15, 16 and 17, inductor 97 is made up of the split ferrite core or ferroid 100 and the primary and secondary windings 98 and 102 that are shown semi-schematically and in a simplified form in FIGS. 15–17 and wherein core 100 is shown as a complete unsplit annulus. Note that the central annular opening 182 of core 100 has a given diametrical dimension correlated with the diameter of an-imaginary design circle tangent to outside of the shanks of the three short rods or posts 164, 166 and 168 of chassis 112. In assembly the shanks of these short rods 114–160 are adapted to bear against the inner periphery of core 100 after their split snap catch heads have passed axially therethrough during assembly to thereby radially position inductor 97 coaxially with base 130 of chassis 122.

Although core 100 appears as an unsplit annulus in FIGS. 15–17, it preferably is a split annulus as it appears in FIG. 1.

Coil Retainer 116

Figure 29:
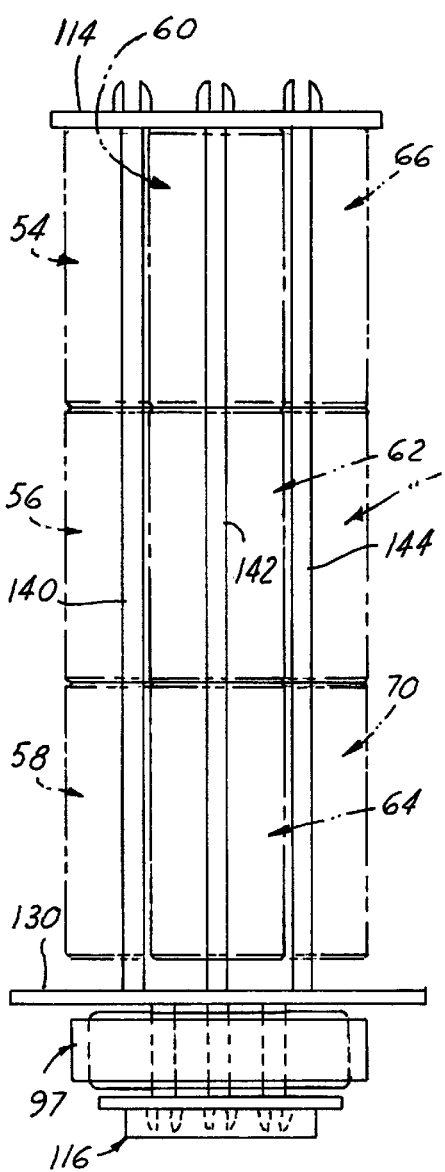
FIG. 29 is a side elevational view of the sub-assembly of the foregoing chassis, condensers mounted thereon (shown in phantom) and held in place temporarily by the position retainer, and the coil mounted beneath the platform base of the chassis and retained thereon by the coil retainer.
Figure 30:
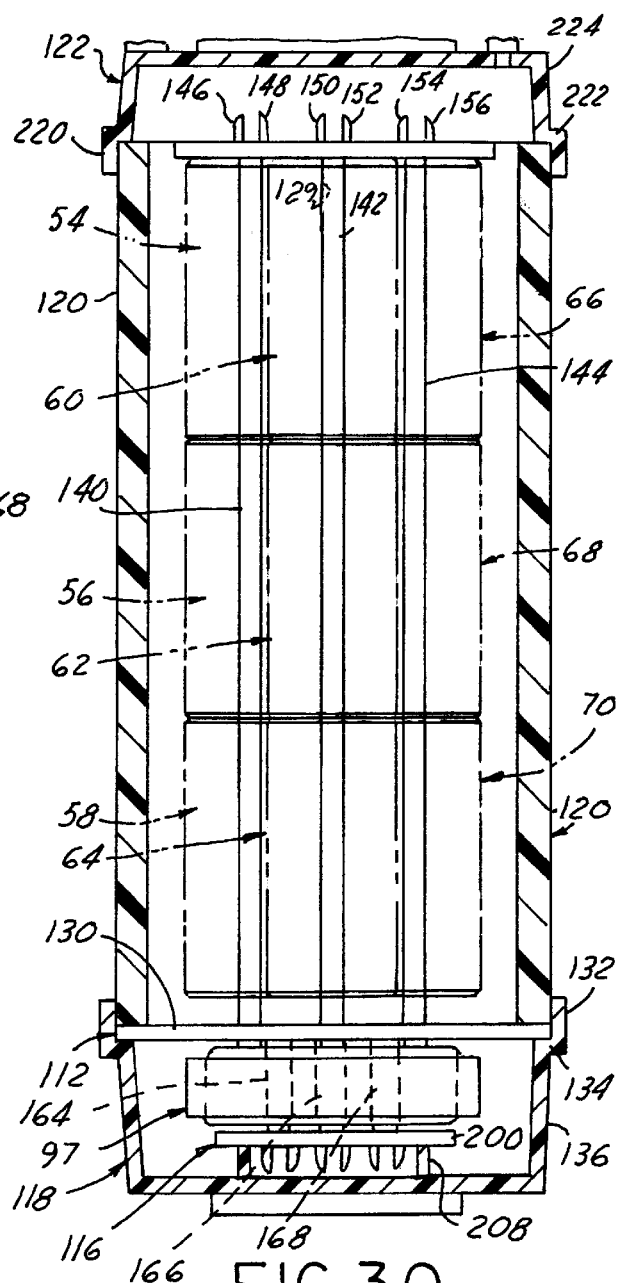
FIG. 30 is a center sectional view of the module of FIGS. 2–6, and illustrating the assembly of the components of FIG. 29 within the housing, coil cap and cover of the module.
Figures 33, 34, 35:
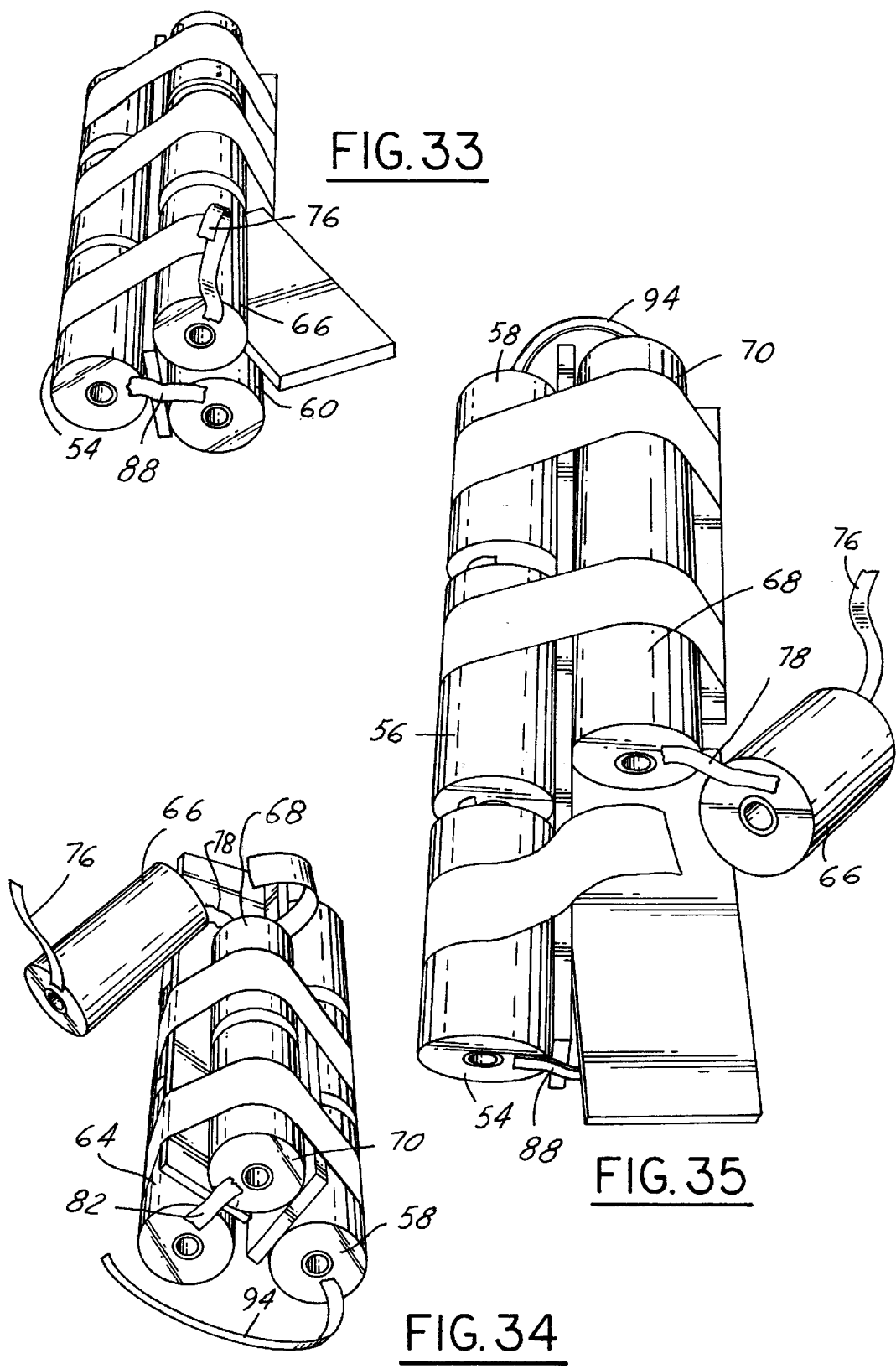

Referring to FIGS. 18, 19 and 20, coil retainer 116 comprises a base portion 200 of planar form and circular in outline. The outer periphery of base 200 has a diameter generally equal to the median diameter of coil core 100 so as to radially overlap abut the same as shown in assembly in FIGS. 2–5. Retainer 200 has three equally angularly spaced apart through-holes 202, 204 and 206 designed to individually respectively receive short rods 164, 166 and 168 therethrough in assembly. The dimensions and design of the spring catch split arrow heads of rods 164–168 is such that, after being cam squeezed when passing through holes 202–306, they snap open and catch-hold coil retainer 200 in proper assembly relationship with inductor 97 against the underside of base 130 of stabilizer 112, as best seen in FIGS. 29 and 30. The underside of retainer 116 has a circular flange 208 coaxial with the circular center hole 210 of base 200 and designed to encircle throughholes 202–206 and to be spaced inwardly from the outer periphery of base 200 as readily seen in FIGS. 19 and 20. Flange 208 stiffens base 200 and adds axial compressive strength to the part. It is also noted that only the upper side of through holes 202, 204 and 206 need be chamfered to provide a caming bevel thereon for passage therethrough of the snap-split catch heads of short rods 164, 166 and 168.

Coil Cover 118

Coil cover 118, in addition to the structure previously described, has imperforate bottom wall 214 that is axially reinforced by a circular dependant rib 216 (FIGS. 22 and 23). Three small diameter electrical lead holes (not shown) are preferably provided in wall 214.

Housing 120

As shown in FIGS. 24 and 25, housing 120 comprises an open ended cylindrical part of uniform constant external and internal diameters and having an axial length slightly greater than the overall axial length of three stacked capacitors 54, 56 and 58 when arrayed in assembly. The wall thickness of housing 120 relative to the remaining parts of the assembly can be scaled from the engineering scaled drawing of FIG. 30, which is incorporated into description by reference for, inter alia, this purpose. Likewise, the axial length of housing 120 relative to the remaining parts can be determined by scaling from FIG. 30.

Cap 122

Referring to FIGS. 26, 27, 28 and 30, cap 122 comprises a base portion made of a cylindrical collar portion 220 integrally joined by a radially extending shoulder flange portion 222 to a side wall 224 of cap 122 that extends with a convergent taper upwardly to its junction with a radially extending annular top wall 226. Cap 122 also has a funnel-like dome 230 made up of a cylindrical bottom wall 232 integral with and disposed concentrically to wall 224 and inset radially therefrom. The inside diameter of wall 232 is spaced slightly radially outwardly of snap-catch heads 146–156 of rods 140–144 in assembly, as best seen in FIG. 6. Dome 230 also comprises an upwardly convergent frustoconical wall 234 rising from wall 232 and terminating integrally in a cylindrical collar portion 236. Collar 236 has a cylindrical through-bore 238 defining an access opening through cap 122 to the interior of housing 120 in assembly therewith. Cap wall 226 has a pair of diametrically opposed through-openings in the form of a hole 240 (FIG. 28) and another through-hole (not shown) registering with the through-bore of a fill pipe 242 that rises from wall 226 to an open upper end generally even with the upper end of collar 226. (FIG. 27)

Sequence of Assembly of Components of Filter Module 110

Assume that the three stacks of capacitors 54–70 are arrayed as in FIG. 7 and electrically connected in series by the foil lead strips as shown and described in conjunction with FIG. 1 hereinabove. The triple stack array is spindled by centering and then sliding one stack down on each of the rods 140, 142 and 144 of chassis 112. The lower most capacitors 58, 64 and 70 of this triple stack respectively rest on the stand-off ribs 158, 160 and 162, leaving the snap catch tang heads 146–156 at the upper ends of the rods protruding a slight distance above the upper ends of the upper-most capacitors 54, 60 and 66. Position stabilizer 114 is then installed on the chassis by axially aligning holes 170, 172 and 174 individually with catch heads 146–148; 150–152; and 154–156. Stabilizer 114 is then pushed downwardly to force the spring catch heads through these holes. As the stabilizer abuts the upper ends of capacitors 54, 60 and 66, the spring catch tangs snap out over the upper surface of the stabilizer to thereby catch-hold the same and secure the capacitors axially on chassis 112.

Inductor 97 is then assembled to the underside of chassis base 130 by inserting short rods 164, 166 and 168 through the center opening of core 100 until the windings 98 and 102 abut the undersurface of base 130. Then coil retainer 116 is installed by aligning holes 202, 204 and 206 individually with short rods 164, 166 and 168 and then pushing the retainer upwardly to force their snap heads through these retainer holes until they catch on the underside of coil retainer base 200 to thereby hold the inductor 97 in assembly with chassis 112.

The output lead 94 from the capacitor array is then soldered to the input lead 96 of inductor 97. Note that base 130 (FIG. 9) has a notch 131 to facilitate passage of these leads from above and below base 130 for this soldered connection. Notch 131 also provides flow space for potting compound, as described hereinafter.

It is also to be noted that coil cover 118 is provided with three small through holes (not shown) in its bottom wall 214. The ground lead 99 (FIG. 1) from primary coil 98 is fed snuggly through one of these holes to the exterior of the coil cover. Likewise, the secondary coil leads 104 and 106 are fed snuggly individually through the other two holes in bottom wall 214 of cover 118 to leave short lengths exposed exteriorly of the cover for appropriate connection to the associated meter terminals.

Coil cover 118 is then assembled to the underside of chassis 112, as shown in FIGS. 2–5 and 30, until chassis base 130 rests on shoulder flange 134. Then the potting compound (e.g., dielectric thermosetting resin) in liquid state is injected into the space below base 130 and above wall 214 via notch 131 so as to fill all of this space, and thereby completely engulf and encapsulate inductor 97, coil retainer 116 and short rods 164–168 in this cover space. Preferably the filling action is done to almost overflowing so that there is potting compound on the upper surface of base 130 but at a level below the upper edge of collar 132. With these parts in their upright orientation (FIG. 29), housing 120 is then telescoped downwardly over the assembled array of capacitors on the spindle rods 140–144 and lowered until the lower end edge of the housing enters collar 132 and rests on the upper surface of base 130 and fitting with a close clearance within the inner surface of collar 132. This submerges the lower edge of housing 120 in the liquid potting compound residing on the upper surface of base 130. The thermoset resin typically cures to solid state in about ten minutes. Thus housing 120 is then thereby adhesively secured to cover 118 with the capacitor array supported accurately both axially and radially in the housing interior with the capacitors spaced by a predetermined clearance dimension from the interior wall surface of the housing and from one stack to the next by their support on chassis 112. The bottom of the housing also is now both bonded and sealed to the coil cover by the cured resin-potting compound.

In the next step, with the partially completed assembly still oriented upright as in FIG. 29, additional liquid potting compound is poured into the interior of housing 120 to fill the same up to the upper edge of the housing, taking care to leave the input lead strip 76 supported so as to emerge upwardly clear from the potting compound. Then lead 76 is fed upwardly into the open bottom end of cap 122 while the same is yet detached from housing 120, and then pulled up through collar opening 238. The free end of lead 76 is soldered to the cabled strands end 52 and then cable end 52 is inserted into cap opening 238 as lead 76 is pulled back into the cap. As best seen in FIG. 30, the cable and cap subassembly is then placed on the upper end of housing 120 so that cap collar 220 encircles the upper edge of housing 120 and shoulder flange 222 seats on the upper edge of housing 120.

With all of the components of module 110 now assembled, more potting compound is introduced into the remaining space enclosed by cap 122 as it sits on the filled housing 120. This is done by injecting the liquid potting compound through the fill pipe 242 of cap 122. During this final filling process the potting compound rises up into the neck collar 236 and fills the slight clearance space remaining between the strands or cable end 52 and the inner wall of collar 236.

Although not shown in FIGS. 26–28, cap 230 may have another fill pipe similar to pipe 242 registered with the other cap hole 240 that may be used to connect to a source of vacuum to assist infilling flow of the potting compound. Likewise hole 240 itself without a pipe may be connected to a vacuum source by a suitable conduit (not shown) to provide vacuum-assist infilling of potting compound.

Once the potting compound injected into the headspace of cap 122 has cured to a solid state the potting compound will have bonded to the cap at the upper edge of housing 120 and to all other engulfed parts so that the module 110 is now a solid assembly of parts bonded together by a thermoset resin to provide a well sealed and rugged assembly with the electrical components well insulated electrically from one another. Hole 240, with or without a riser tube like tube 242, can also be used as a second fill hole so that dual injection can be practiced when using lower viscosity potting compounds that do not need vacuum-assist infilling action. After the assembly is completed and the resin is cured, if desired, pipe 242 (and another pipe associated with hole 240) may be cut off flush with wall 226 of cap 122. However one or both fill pipes may be left in place without adversely affecting the performance of module 110.

From the forgoing description and accompanying drawings, it will now be understood by those of ordinary skill in the art that the injected molded plastic parts comprising chassis 112, position stabilizer 114, coil retainer 116, coil cover 118, housing 120 and cap 122 cooperate to position and hold the cylindrical capacitors 54–70 and ferroid-type coil inductor 97 in proper position to allow them to be adequately surrounded by infilling with a dielectric insulation potting compound. This compound preferably is a suitable thermoset resin added as a liquid and allowed to cure to a solid state to thereby provide not only the necessary electrical insulating properties but also bonding of the various components in a rugged array and for protection of the components from harsh environments in the normal outdoor applications on the utility poles. The potting compound encasing the various parts holds fast all of the assembly frame parts and related parts including the solder joints, and maintains reliably the relative positions of all internal components during shocks and abuse from shipment, testing, installation, and for the duration of the useful life of the filter module.

Another feature to note is that the wound capacitors, prior to their assembly onto the chassis spindle rods 140–144, can be electrically coupled in series by making the soldered connections of the leads 78–92 to the respectively associated capacitors. Then, after initial assembly of the capacitors onto chassis 112 by spindling the three capacitors stacks on rods 140–144, chassis 112 serves as a convenient assembly fixture for holding the capacitors in place during the additional soldering operations involved in connecting lead 94 to lead 96 of inductor 97 and lead 76 to cable 50.

Chassis 112 and associated position stabilizer 114 can also serve as a shipping fixture for the capacitors after they have been connected in a series by the soldering operation on leads 78–92 and prior to connection to inductor 97 and cable 50. With the capacitors spindled on rods 140–144 and captured between base 130 of the chassis and position stabilizer 114, this chassis 112 can serve as convenient cradle for shipping of this capacitor loaded subassembly from the capacitor manufacturer to the module final assembly manufacturing facility. Since the spooling method of wound capacitor construction is conventional and normally results in a central through bore 130, this feature is taken advantage of by chassis 112 having its spindle rods 140–144 designed to fit into and slide through these center bores to thereby support and orient the capacitors individually and in a predetermined stack-up array without requiring any additional operations in the manufacturer of the capacitors.

The position stabilizer 114 readily snaps onto the upper ends of the spindle rods 140–144 and is captured against axial lift-off therefrom by the split catch locking tang heads 146–156. The position stabilizer serves to lock the capacitors 54–70 onto chassis 112, and also to position these capacitors at a fixed distance from each other radially of the array and from the inside wall of housing 120. This ensures that the correct amount of electrical insulating material space is established and maintained during the pouring process of the thermosetting dielectric fluid as well as during the curing process of the same. Likewise the thin ribs 158, 160 and 162 projecting from base 130 and spindle rods 140, 142 and 144 function as standoffs to elevate the bottom-most capacitor in each stack so that it is held spaced away from base 130 to thereby allow the for potting material to flow and fill completely around and underneath the capacitors for optimal insulating and protection characteristics.

Preferably the insulating/potting material is made of a mixture of recycled glass and thermosetting resin(s), or a mixture of silica and thermosetting resins. This mixture electrically insulates, protects and bonds all of the components into one "impossible to disassemble" unit. Preferably all of the plastic components used in the filter assembly module (i.e. chassis 112, stabilizer 114, coil retainer 116, cover 118 and cap 122 are injection molded using an ultraviolet stabilized, glass filled (for reinforcement), polycarbonate or PC/ABS blend. Housing 120 may also be made of such material or if desired of a less expensive plastic material having electrical insulation properties.

FIG. 31 illustrates a modified chassis component 112 which is identical to chassis 112 except for the base portion 130. Base 130, instead of being circular in outline like base 130 is made with a generally triangular shape with two sides 133 and 135 extending generally at right angle to one another and with the third hypotenuse side 137 having a curvature matching that of the inside of the housing 120 but made up of three straight segments angled relative to one another. Side 137 terminates at its diametrically opposite ends in a pair of centering tabs 139 and 141, and the junction of sides 133 and 135 is formed into a third centering tab 143. Tabs 139, 141 and 143 are spaced and oriented by base 130 to have a close clearance fit within housing 120 to thereby center the array of the spindle rods 140–144 about the longitudinal axis of housing 120 in assembly there with.

Another modification of the method and module construction of the invention is to invert and dip the subassembly of chassis 112, capacitors 54–70, position stabilizer 114, cover 118, inductor assembly 97 and coil retainer 116 (after potting of the components 97 and 116 in cover 118) into a bath of a highly insulative dielectric resin compound to thereby merely coat (followed by curing) the capacitor array with such material. Then the remaining air spaces existing after housing 120 is telescoped onto this coated array are infilled with sand or other inexpensive insulating material. Cover 122 is then installed, filled and secured with adhesive potting material as before.

From the forgoing description and accompanying drawings as referenced to the description, it also will now be apparent to one of ordinary skill in this art that the filter assembly module 110 of the invention amply fulfills one or more of the aforestated objects and provides many novel features and advantages. The injection molded plastic components of the assembly may be economically manufactured to close tolerances on a mass production basis and cooperate with the electrical inductance and capacitance components in enabling the foregoing economical method of manufacture and assembly of module 110, also in accordance with the present invention. This finished module 110 is extremely rugged, weather resistant and constructed to withstand extremely high voltages when electrically coupled between a high voltage power transmission line and ground. Module 110 may be appropriately designed and rated to operate as a band reject filter for the power line transmission frequency, typically 60 HZ. The conventional meter or other digital communication device connected across output leads 104 and 106, due to the filtering action of module 110, is not adversely affected in performing its power line metering function by the strong power line transmission noise, i.e., 60 cycle "hum". Hence a plurality of filter/meter units individually pole mounted along the power transmission sub branch distribution line feeding ultimate consumers can be installed at predetermined and known pole locations. These pole meters can then be read remotely by radio transmission capability built into the meter, or by conventional telemetering circuitry provided in the meter operable for sending digital information over the power line. This will enable the utility to pin point the pole-to-pole geographic area where excessive metered power is being consumed and not recorded on customer meters, whether by unauthorized meter-jump hook ups or by power line faults such as incipient short circuits.

What is claimed is:

1. A filter assembly module comprising a cylindrical housing initially open at its opposite ends as made, a chassis component disposed within the housing and having a base with a profile configuration adapted to contact the inner wall of the housing for centering the chassis radially in the housing, said chassis having at least one spindle rod extending within said housing from said base, a capacitor mounted on said spindle rod by having the spindle rod extend axially through a central through-passage of the capacitor, a position stabilizer mounted on said spindle rod on the side of the said capacitor remote from said chassis base, an inductance component disposed beneath said chassis base and held initially in assembly therewith by a plurality of short rods protruding from the base, and by a retainer received on the ends of said short rods protruding beyond said inductance component, a cover secured and closing one end of said housing and enclosing therein said inductance component and said retainer, a cap secured to the opposite end of said housing and closing the same, and electrical circuit connector means extending through said cap and operably and electrically coupled to said capacitor and said inductance component and providing a ground connection as well as a inductively coupled output signal for coupling to an associated meter or other communication device, the interior space defined between the interior walls of said housing, said cover and said cap and the exterior surfaces of said capacitor and said inductance component as well as the exterior surfaces of said chassis, said position stabilizer and said retainer being totally immersed and engulfed in a flowable insulation material infilled in and filling said housing, cover and cap.

2. The filter module of claim 1 wherein said chassis has three of said spindle rods extending parallel to one another and spaced apart with their longitudinal axes oriented in a equilateral triangle array, and wherein said capacitor comprises three sets of a plurality of capacitors electrically coupled in series and spindle supported one set on each said spindle rods.

3. The filter module of claim 2 wherein said inductance component comprises an inductor in the form of an annular core having a primary winding thereon with its opposite leads coupled to the output lead of said series coupled capacitors and the other lead connected to ground, and a secondary winding on said core having its opposite ends forming output leads adapted for coupling to the input terminals of the associated meter or other digital communication device.

4. The filter module of claim 1 wherein said flowable insulation material comprises a solidified and cured thermosetting dielectric insulation material initially in an uncured liquid state when said module components are being infilled with such insulation material.

5. The filter module of claim 4 wherein said capacitor comprises a cylindrical spool-wound capacitor wherein said capacitor central passage is spool formed in its manufacture.

6. A method of constructing a filter module comprising a cylindrical housing initially open at its opposite ends as made, a chassis component disposed within the housing and having a base with a profile configuration adapted to contact the inner wall of the housing for centering the chassis radially in the housing, said chassis having at least one spindle rod extending within said housing from said base, a capacitor mounted on said spindle rod by having the spindle rod extend axially through a central through-passage of the capacitor, a position stabilizer mounted on said spindle rod on the side of the said capacitor remote from said chassis base, an inductance component disposed beneath said chassis base and held initially in assembly therewith by a plurality of short rods protruding from the base, and by a retainer received on the ends of said short rods protruding beyond said inductance component, a cover secured and closing one end of said housing and enclosing therein said inductance component and said retainer, a cap secured to the opposite end of said housing and closing the same, and electrical circuit connector means extending through said cap and operably and electrically coupled to said capacitor and said inductance component and providing a ground connection as well as a inductively coupled output signal for coupling to an associated meter or other communication device, the interior space defamed between the interior walls of said housing, said cover and said cap and the exterior surfaces of said capacitor and said inductance component as well as the exterior surfaces of said chassis, said position stabilizer and said retainer being totally immersed and engulfed in a flowable insulation material infilled in and filling said housing, cover and cap, said method comprising the steps of:

(a) said capacitor and inductance component are first assembled to said chassis and then the unoccupied space enclosed by said cover is filled with flowable insulation material, (b) then said lower end of the housing is seated on said cover and is immersed at its lower edge in the insulation material filling the cover, (c) then said housing is filled with the flowable insulation material to engulf the capacitor components therein while being held on said spindle rod and likewise engulfing the chassis structure disposed within the housing and so filling the housing to its upper end brim, (d) then feeding the electrical circuit connector means through the cap and then mounting the cap on the upper end of the housing, and (e) then infilling the space within the cap with additional flowable insulation material to thereby finish filling of the entire space enclosed within the said housing, cover and cap with the flowable insulation material.

7. The method of claim 6 wherein said flowable insulation material comprises a solidified and cured thermosetting dielectric insulation material initially in an uncured liquid state when said module components being infilled with said insulation material.

8. A filter assembly module comprising a cylindrical housing initially open at its opposite ends as made, a chassis component disposed within the housing and having a base with a profile configuration adapted to contact the inner wall of the housing for centering the chassis radially in the housing, said chassis having at least one spindle rod extending within said housing from said base parallel to the longitudinal axis of the housing and perpendicular to the major plane of the base of the chassis, a cylindrical spool-wound capacitor mounted on said spindle rod by having the spindle rod extend axially through a spool-formed central through-passage of the capacitor, a position stabilizer mounted on said spindle rod on the side of the said capacitor remote from said chassis base, a circular inductance component having an open center and being disposed beneath said chassis base and held initially in assembly therewith by a plurality of short rods protruding from the base and extending with close fit through and beyond said center opening, a retainer received on the ends of the short rods protruding beyond said inductance component with a snap fit retention thereon, a cover secured and closing one end of said housing and enclosing therein said inductance component, said short rods and said retainer, a cap secured to the opposite end of said housing and closing the same, and electrical circuit connector means extending through said cap and operably and electrically coupled to said capacitor and said inductance component and providing a ground connection as well as a inductively coupled output signal for coupling to an associated meter or other communication device, the interior space defined between the interior walls of said housing, said cover and said cap and the exterior surfaces of said capacitor and said inductance component as well as the exterior surfaces of said chassis, said position stabilizer and said retainer being totally immersed and engulfed in a solidified thermosetting dielectric insulation material cast in-situ in said housing, cover and cap.

9. The filter module of claim 8 wherein said chassis has three of said spindle rods extending parallel to one another and spaced apart with their longitudinal axes oriented in a equilateral triangle array, and wherein said capacitor comprises three sets of a plurality of spool-wound capacitors electrically coupled in series and spindle supported one set on each said spindle rods.

10. The filter module of claim 9 wherein said inductance component comprises an inductor in the form of an annular core having a primary winding thereon with its opposite leads coupled to the output lead of said series coupled capacitors and the other lead connected to ground, and a secondary winding on said core having its opposite ends forming output leads adapted for coupling to the input terminals of the associated meter or other digital communication device.

11. A method of constructing a filter module comprising a cylindrical housing initially open at its opposite ends as made, a chassis component disposed within the housing and having a base with a profile configuration adapted to contact the inner wall of the housing for centering the chassis radially in the housing, said chassis having at least one spindle rod extending within said housing from said base parallel to the longitudinal axis of the housing and perpendicular to the major plane of the base of the chassis, a cylindrical spool-wound capacitor mounted on said spindle rod by having the spindle rod extend axially through a spool-formed central through-passage of the capacitor, a position stabilizer mounted on said spindle rod on the side of the said capacitor remote from said chassis base, a circular inductance component having an open center and being disposed beneath said chassis base and held initially in assembly therewith by a plurality of short rods protruding from the base and extending with close fit through and beyond said center opening, a retainer received on the ends of the short rods protruding beyond said inductance component with a snap fit retention thereon, a cover secured and closing one end of said housing and enclosing therein said inductance component, said short rods and said retainer, a cap secured to the opposite end of said housing and closing the same, and electrical circuit connector means extending through said cap and operably and electrically coupled to said capacitor and said inductance component and providing a ground connection as well as a inductively coupled output signal for coupling to an associated meter or other communication device, the interior space defined between the interior walls of said housing, said cover and said cap and the exterior surfaces of said capacitor and said inductance component as well as the exterior surfaces of said chassis, said position stabilizer and said retainer being totally immersed and engulfed in a solidified thermosetting dielectric insulation material cast in-situ in said housing, cover and cap, said method comprising the steps of:

(a) assembling said capacitor and inductance component to said chassis, (b) then filling the unoccupied space enclosed by said cover with potting compound in a liquid state, (c) then seating said lower end of the housing on said cover and immersing its lower edge in the potting compound filling the cover, (d) then filling said housing with potting compound to engulf the capacitor components therein while being held on said spindle rod and likewise engulfing the chassis structure disposed within the housing and so filling the housing to its upper end brim with the potting compound, (e) then feeding the electrical circuit connector means through the cap, (f) then mounting the cap on the upper end of the housing, (g) then infilling the space within the cap with additional potting compound to thereby finish filling of the entire space enclosed within the said housing, cover and cap with potting compound, and (h) allowing said potting compound to cure to its hardened state to thereby adhesively bind said module components, said housing, said cap and said cover together.

12. The module of claim 9 wherein said spindle rods each have resilient arrowhead-like split upper ends, and said position stabilizer has through-holes snap-receiving said spindle rods upper ends therethrough to thereby hold said stabilizer axially on said spindle rods.

13. The module of claim 12 wherein said stabilizer comprises a planar member having an open triangular configuration in the major plane of said stabilizer.

14. A filter assembly module comprising a generally tubular housing, a chassis component disposed within the housing and having a base with a profile configuration adapted to contact the inner wall of the housing for centering the chassis radially in the housing, said chassis having at least one spindle rod extending axially within said housing from said base, a capacitor mounted on said spindle rod by having the spindle rod extend axially through a central through-passage of the capacitor, a position stabilizer mounted on said spindle rod on the side of said capacitor remote from said chassis base and having a profile configuration adapted to contact the inner wall of the housing for centering the chassis radially in the housing, an inductance component disposed beneath said chassis base and held initially in assembly therewith by a plurality of short rods protruding from the base at their distal ends, and by a retainer received on the distal ends of said short rods that protrude beyond said inductance component, said housing having a cover closing one end of said housing and enclosing therein said inductance component and said retainer, said housing also having a cap closing the axially opposite end of said housing, and electrical circuit connector means extending-through said cap and operably and electrically coupled to said capacitor and said inductance component and providing a ground connection as well as an inductively coupled output signal for coupling to an associated metering device or other communication device, the interior space defined between the interior walls of said housing, said cover and said cap and the exterior surfaces of said capacitor and said inductance component as well as the exterior surfaces of said chassis, said position stabilizer and said retainer being totally immersed and engulfed in an electrical insulation material filling said housing, cover and cap.

15. The filter module of claim 14 wherein said chassis has three of said spindle rods extending parallel to one another and spaced apart with their longitudinal axes oriented in an equilateral triangle array, and wherein said capacitor comprises three sets of a plurality of capacitors electrically coupled in series and spindle supported one set on each of said spindle rods.

16. The filter module of claim 15 wherein said inductance component comprises an inductor in the form of an annular core having a primary winding thereon with its opposite leads coupled to the output lead of said series coupled capacitors and the other lead connected to ground, and a secondary winding on said core having its opposite ends forming output leads adapted for coupling to the input terminals of the associated metering device or other digital communication device.

17. The filter module of claim 14 wherein said insulation material comprises a solidified and cured thermosetting dielectric insulation material initially in an uncured liquid state when said module components are being engulfed by such insulation material.

18. The filter module of claim 17 wherein said capacitor comprises a cylindrical spool-wound capacitor and wherein said capacitor central passage is spool formed in its manufacture.

19. The filter assembly module of claim 14 wherein said housing is cylindrical, wherein said spindle rod extends within said housing from said base parallel to the longitudinal axis of the housing and perpendicular to the major plane of the base of the chassis, wherein said capacitor is a cylindrical spool-wound capacitor mounted on said spindle rod by having said spindle rod extend axially through a spool-formed central through-passage of the capacitor, wherein said inductance component is an annulus having a center opening and is disposed beneath said chassis base and held initially in assembly therewith by said plurality of short rods protruding from the base and extending with close fit through and beyond said annulus center opening, and wherein said retainer has a snap fit retention as received on the ends of the rods protruding beyond said inductance component.

20. The filter module of claim 19 wherein said chassis has three of said spindle rods extending parallel to one another and spaced apart with their longitudinal axes oriented in an equilateral triangle array, and wherein said capacitor comprises three sets of a plurality of spool-wound capacitors electrically coupled in a series and spindle supported one set on each of said spindle rods.

21. The filter module of claim 20 wherein said spindle rods each have resilient arrowhead-like split upper ends, and said position stabilizer has through-holes snap-receiving said spindle rods upper ends therethrough to thereby hold said stabilizer axially on said spindle rods.

22. The filter module of claim 21 wherein said stabilizer comprises a planar member having an open triangular configuration in the major plane of said stabilizer.

* * * * *